(12) United States Patent
Fang et al.

(10) Patent No.: US 6,692,988 B2
(45) Date of Patent: Feb. 17, 2004

(54) METHOD OF FABRICATING A SUBSTRATE-BASED SEMICONDUCTOR PACKAGE WITHOUT MOLD FLASH

(75) Inventors: Chien Hsiu Fang, Taichung Chien (TW); Liao Chih Chin, Changhwa (TW)

(73) Assignee: Siliconware Precision Industries Co., Ltd. (TW)

( * ) Notice: Subject to any disclaimer, the term of this patent is extended or adjusted under 35 U.S.C. 154(b) by 90 days.

(21) Appl. No.: 10/003,580

(22) Filed: Nov. 14, 2001

(65) Prior Publication Data
US 2003/0040143 A1 Feb. 27, 2003

(51) Int. Cl.[7] .......................... H01L 21/48; H01L 21/50; H01L 33/00; H01L 23/22; H01L 23/28
(52) U.S. Cl. ....................... 438/112; 438/126; 438/127; 257/88; 257/687; 257/796
(58) Field of Search ................. 438/112, 126, 438/127; 257/88, 687, 796

(56) References Cited

U.S. PATENT DOCUMENTS 5,744,084 A    4/1998   Chia et al. ................... 264/276
6,492,199 B2 * 12/2002  Osawa et al. ................ 438/111

* cited by examiner

Primary Examiner—Caridad Everhart
Assistant Examiner—Chuong A Luu
(74) Attorney, Agent, or Firm—Mikio Ishimaru

(57) ABSTRACT

A method is proposed for fabricating a substrate-based semiconductor package without mold flash. The proposed method is characterized by the provision of one or more dummy traces between each overly-spaced pair of signal traces that might cause mold flash in subsequent molding process, so that the solder mask covering over these traces can be made substantially planarized in its top surface without the undesired forming of a recessed portion that would otherwise cause leakage of molding material to the outside of the molding region during molding process. Owing to the provision of these dummy traces, no leakage hole would exist between the molding tool and the solder mask, thus preventing mold flash. The proposed method therefore allows the finished semiconductor package to be more assured in quality.

5 Claims, 5 Drawing Sheets

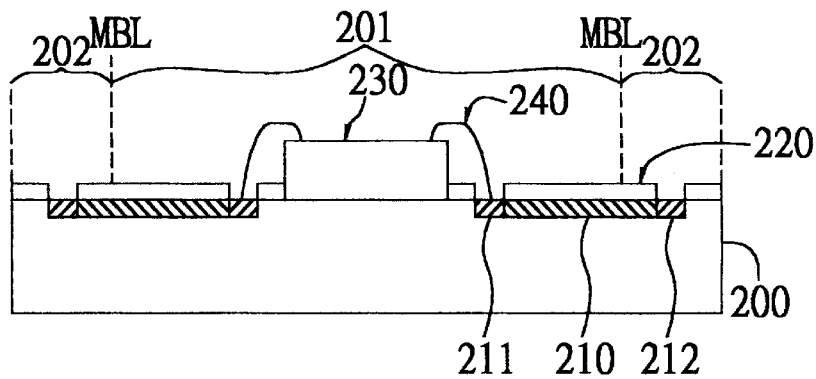
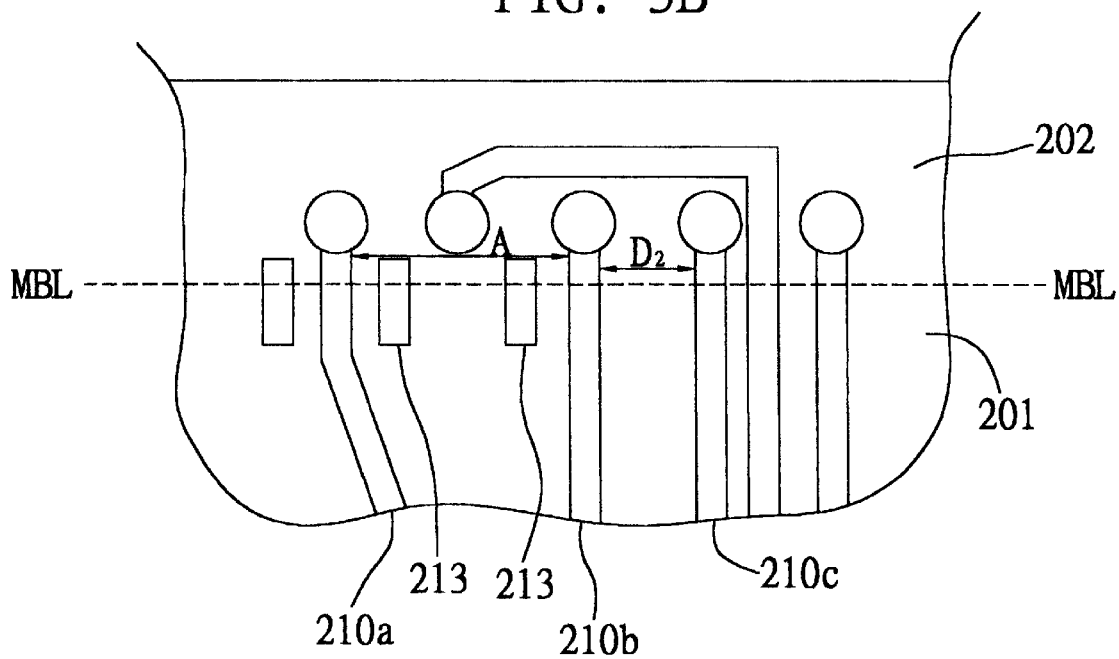

METHOD OF FABRICATING A SUBSTRATE-BASED SEMICONDUCTOR PACKAGE WITHOUT MOLD FLASH

BACKGROUND OF THE INVENTION

1. Field of the Invention

This invention relates to semiconductor packaging technology, and more particularly, to a method of fabricating a substrate-based semiconductor package without mold flash.

2. Description of Related Art

A substrate-based semiconductor package is a type of semiconductor package that utilizes a circuited substrate as chip carrier for mounting one or more semiconductor chips thereon. BGA (Ball Grid Array) package is an example of substrate-based semiconductor package. Typically, a semiconductor package substrate is formed with a predefined pattern of electrically-conductive traces serving as signal lines for electrically connecting the packaged semiconductor chip to external connecting points.

FIGS. 1A–1D are schematic diagrams showing a conventional method for fabricating a substrate-based semiconductor package (note that these drawings are simplified schematic diagrams showing only a small number of components that are related to the invention for demonstrative purpose, and which are not drawn to actual sizes and scales in practical applications; the practical layout on the semiconductor package may be much more complex).

Referring to FIG. 1A and FIG. 1B, this semiconductor package is constructed on a substrate 100 as chip carrier. The substrate 100 is partitioned by a predefined mold border line MBL into a molding region 101 and a non-molding region 102; wherein the molding region 101 is the region where an encapsulation body (shown later in FIG. 1D with the reference numeral 160) is to be molded, while the non-molding region 102 is the region beyond the molding region 101 that is not to be encapsulated.

Further, the substrate 100 is formed with a predefined pattern of electrically conductive traces 110 on the front side thereof, each trace 110 having an inner terminal 111 located within the molding region 101 and an outer terminal 112 located outside the molding region 101. Next, a solder mask 120 is formed from an electrically-insulative material over the substrate 100 to cover the traces 110 while exposing necessary bonding points.

In the die-bonding process, at least one semiconductor chip 130 is mounted over the molding region 101 of the substrate 100, and which is then electrically connected to the inner terminals 111 of the traces 110 by means of bonding wires 140.

Referring further to FIG. 1C, in the next step, a molding process is performed by using a molding tool 150 having a hollowed cavity 151; wherein the semi-finished package assembly shown in FIG. 1A is fixed in the cavity 151 of the molding tool 150, with the inner wall 152 of the cavity 151 being aligned to the predefined mold border line MBL on the substrate 100. A molding material 153, such as epoxy resin, is then injected through an injection path (not shown) into the cavity 151 of the molding tool 150 until filling up the entire void space of the cavity 151.

Referring further to FIG. 1D, as the foregoing molding process is completed, an encapsulation body 160 is formed over the molding region 101 of the substrate 100 to encapsulate the semiconductor chip 130.

One problem to the foregoing packaging process, however, as shown in FIG. 2A, in the case of some of the traces 110 are spaced at overly large intervals across the mold border line MBL (as for example the two traces 110a, 110b shown in FIG. 1B), it would undesirably cause mold flash 170 over the non-molding region 102 of the substrate 100 just outside the encapsulation body 160. This is because that, in the case of FIG. 1B, the traces 110 are designed in such a manner that the interval $D_1$ between the two neighboring traces 110a, 110b is overly larger than the normal interval $D_2$ between the next neighboring pair of traces 110b, 110c; and as illustrated in FIG. 2B, when the solder mask 120 is coated over the substrate 100, this overly-large interval $D_2$ would cause a recessed portion 121 in the part of the solder mask 120 that is located between these two neighboring traces 110a, 110b. As further illustrated in FIG. 2C, during the molding process, this recessed portion 121 would result in a leakage hole for the molding material 153 injected into the cavity 151 of the molding tool 150 (see FIG. 1C), thus undesirably causing the mold flash 170. The presence of this mold flash 170 over the substrate 100 would undesirably degrade the quality of the finished semiconductor package.

Related patents, include, for example, the U.S. Pat. No. 5,744,084 entitled "METHOD OF IMPROVING MOLDING OF AN OVERMOLDED PACKAGE BODY ON A SUBSTRATE". This patented technology is characterized by the use of a dam structure to prevent mold flash. One drawback to this solution, however, is that the provision of the dam structure is quite complex in process and thus would considerably increase the overall fabrication cost.

SUMMARY OF THE INVENTION

It is therefore an objective of this invention to provide a new method of fabricating a substrate-based semiconductor package, which can help prevent the above-mentioned problem of mold flash while is more cost-effective to implement.

The method according to the invention comprising the step of: (1) preparing a substrate having one surface partitioned by a predefined mold border line into a molding region and a non-molding region: (2) providing a plurality of electrically-conductive traces over the substrate, each trace having an inner terminal located within the molding region and an outer terminal located within the non-molding region; (3) providing a plurality of dummy traces across the mold border line and interposed between those electrically-conductive traces that are spaced at an interval greater than a predetermined distance that is destined to cause mold flash; (4) providing a solder mask over the substrate to cover the electrically-conductive traces and the dummy traces; and (5) performing a molding process to form an encapsulation body on the molding region of the substrate.

The method of the invention is characterized by the provision of one or more dummy traces between each overly-spaced pair of signal traces to help the solder mask covering over these traces to be substantially planarized in its top surface without the undesired forming of a recessed portion that would otherwise cause leakage of molding material to the outside to the molding region during molding process. Owing to the provision of these dummy traces, no leakage hole would exist between the molding tool and the solder mask, thus preventing mold flash. The proposed method therefore allows the finished semiconductor package to be more assured in quality.

BRIEF DESCRIPTION OF DRAWINGS

The invention can be more fully understood by reading the following detailed description of the preferred embodiments, with reference made to the accompanying drawings, wherein:

FIGS. 3A–3E are schematic diagrams used to depict the method of the invention for fabricating a substrate-based semiconductor package without mold flash.

DETAILED DESCRIPTION OF PREFERRED EMBODIMENTS

Figure 1A:
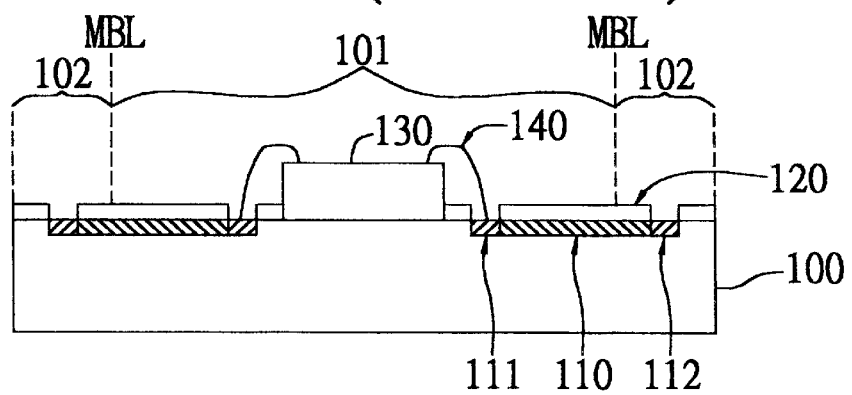
FIGS. 1A–1D (PRIOR ART) are schematic diagrams used to depict a conventional method for fabricating a substrate-based semiconductor package.
Figure 1B:
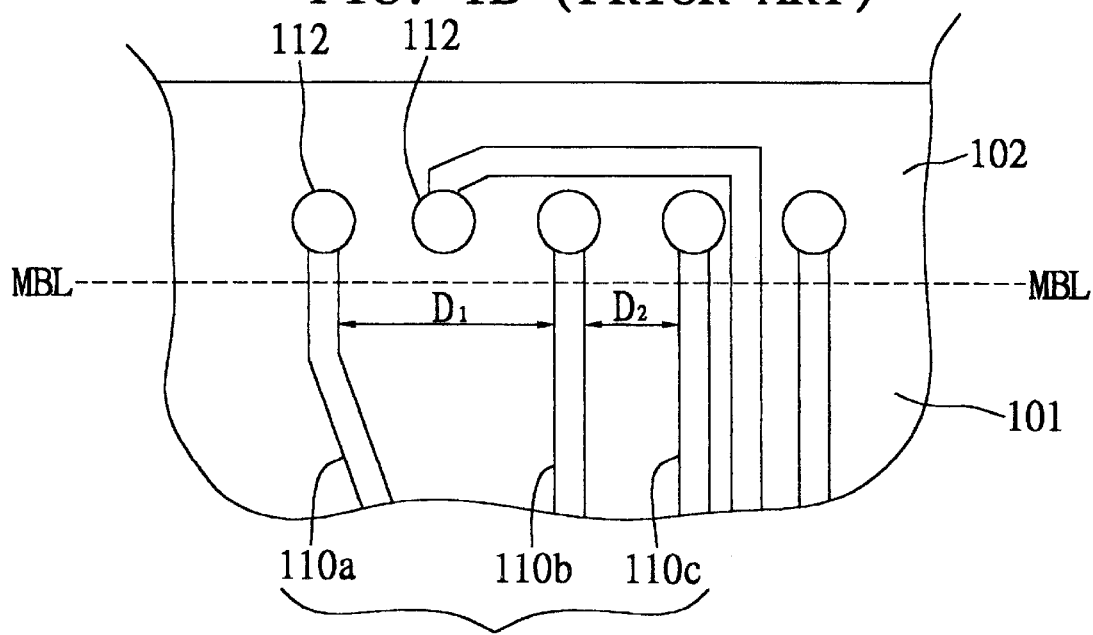
Figure 1C:
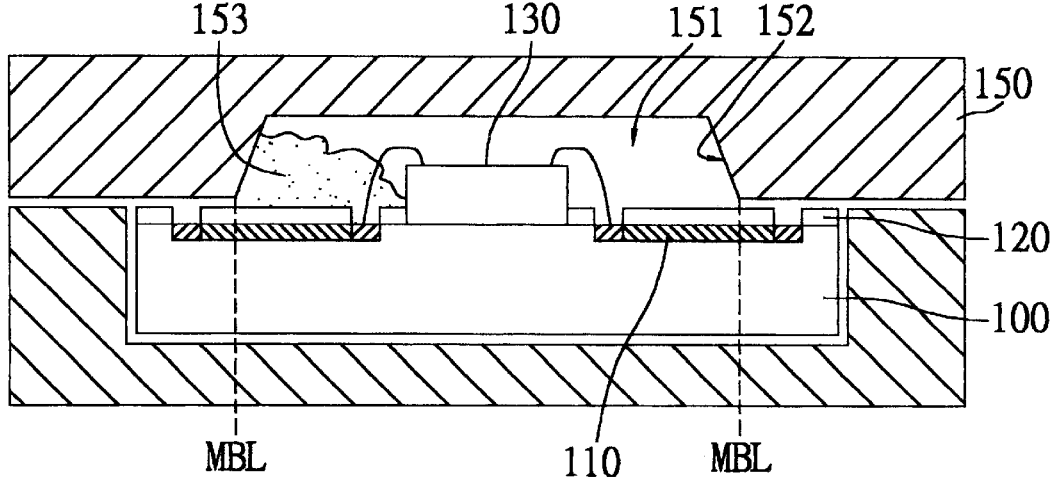
Figure 1D:
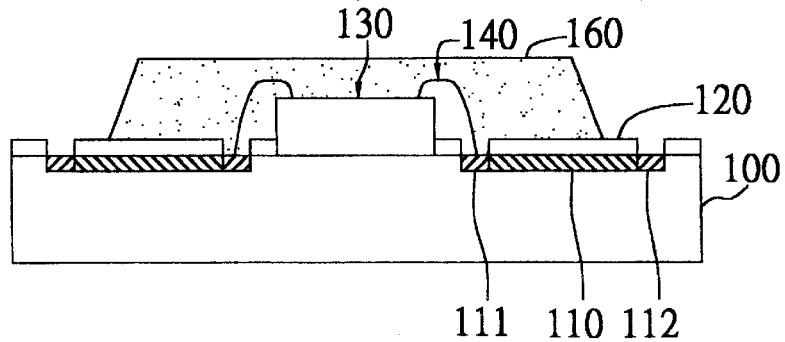
Figure 2A:
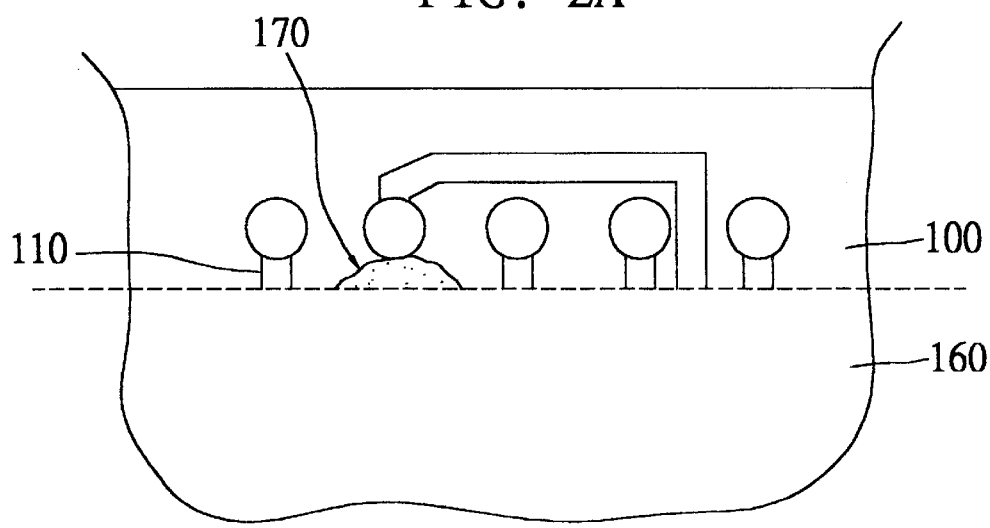
FIGS. 2A–2C (PRIOR ART) are schematic diagrams used to explain the cause of mold flash on the semiconductor package fabricated by conventional method.
Figure 2B:
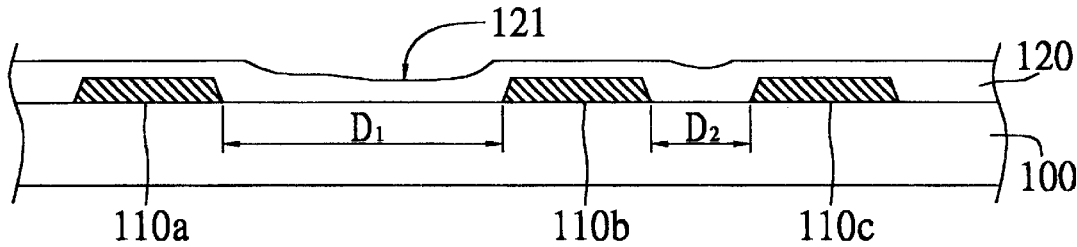
Figure 2C:
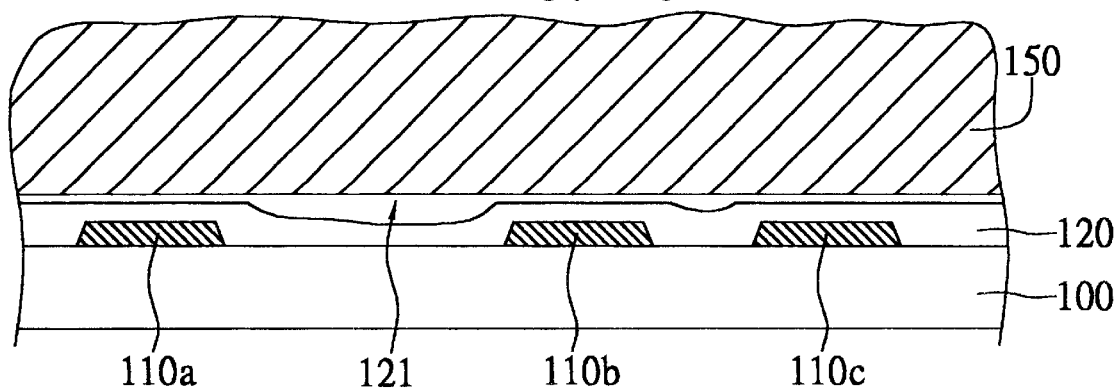

The method according to the invention for fabricating a substrate-based semiconductor package without mold flash is disclosed in full details in the following with reference to FIGS. 3A–3E (note that FIGS. 3A–3E are simplified schematic diagrams showing only a small number of components that are related to the invention for demonstrative purpose, and which are not drawn to actual sizes and scales in practical applications; the practical layout on the semiconductor package may be much more complex).

Referring first to FIG. 3A and FIG. 3B, by the method according to the invention, the first step is to prepare a substrate 200 as chip carrier. The substrate 200 is partitioned by a predefined mold border line MBL into a molding region 201 and a non-molding region 202; wherein the molding region 201 is the region where an encapsulation body (shown later in FIG. 3E with the reference numeral 260) is to be molded, while the non-molding region 202 is the region beyond the molding region 201 that is not to be encapsulated.

Next, a predefined pattern of electrically conductive traces 210 are formed, typically from copper (Cu), on the front side of the substrate 200, each trace 210 having an inner terminal 211 located within the molding region 201 and an outer terminal 212 located outside the molding region 201.

As shown in FIG. 3B, assume the traces 210 includes a first neighboring pair 210a, 210b which are spaced at an overly large interval $D_1$ across the mold border line MBL. As mentioned in the background section of this specification, this overly-spaced pair of traces 210a, 210b would cause mold flash in subsequent molding process. As a solution to this problem, the invention provides one or more dummy traces 213 between this overly-spaced pair of traces 210a, 210b. As a general rule, dummy traces are interposed between those electrically-conductive traces that are spaced at an interval greater than a predetermined minimum flash-causing distance $D_{min}$, that is judged by experiments to be destined to cause mold flash across the mold border line MBL. The predetermined minimum flash-causing distance $D_{min}$ is preferably not greater than $0.9_{min}$, and more preferably not greater than $0.5_{min}$. In the circuit layout design, if any neighboring pair of electrically-conductive traces are spaced larger than this minimum flash-causing distance $D_{min}$ across the mold border line MBL, then one or more dummy traces are interposed therebetween. In practice, these dummy traces 213 can be an integrated part of the circuit layout design for the traces 210; and therefore these dummy traces 213 can be conveniently fabricated together with the traces 210 through the same metallization process, such as a copper-based metallization process.

Figure 3C:
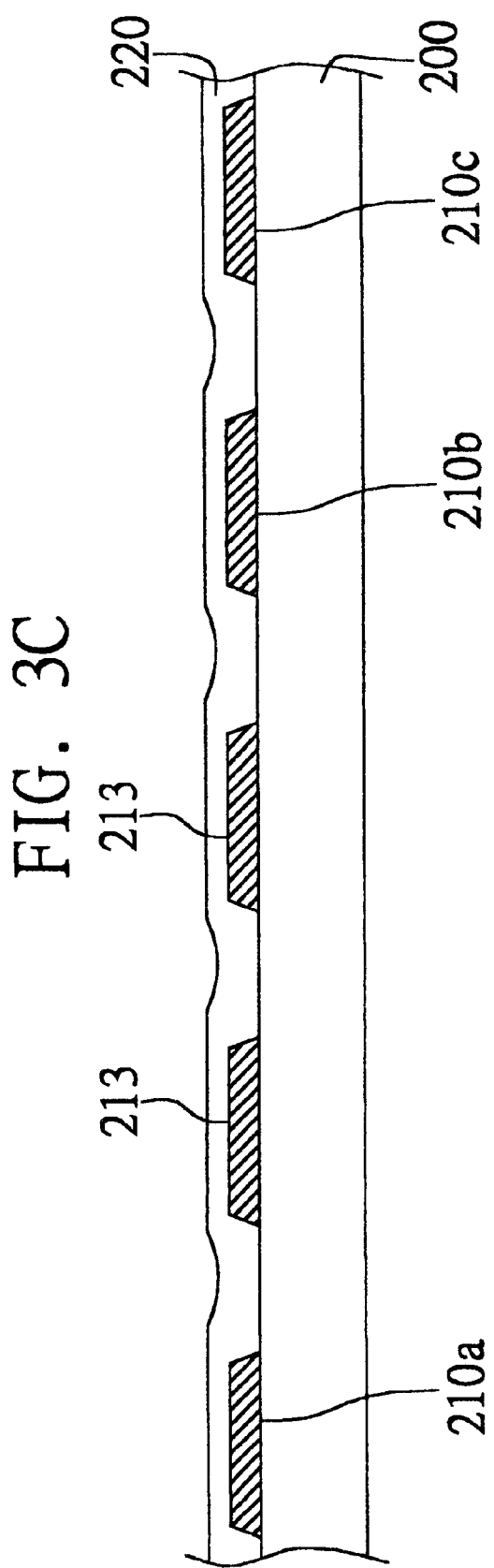

In the next step, a solder mask 220 is formed from an electrically-insulative material over the substrate 200 to cover all the traces 210 and the dummy traces 213 but exposing necessary connecting points on the traces 210. As illustrated in FIG. 3C, the provision of the dummy traces 213 would allow the solder mask 220 to be substantially planarized in its top surface, without the undesired forming of a recessed portion between the overly-spaced pair of traces 210a, 210b as in the case of the prior art.

In the die-bonding process, at least one semiconductor chip 230 is mounted over the substrate 200 within the molding region 201, and which is electrically connected to the inner terminals 211 of the traces 210 by means of bonding wires 240.

Figure 3D:
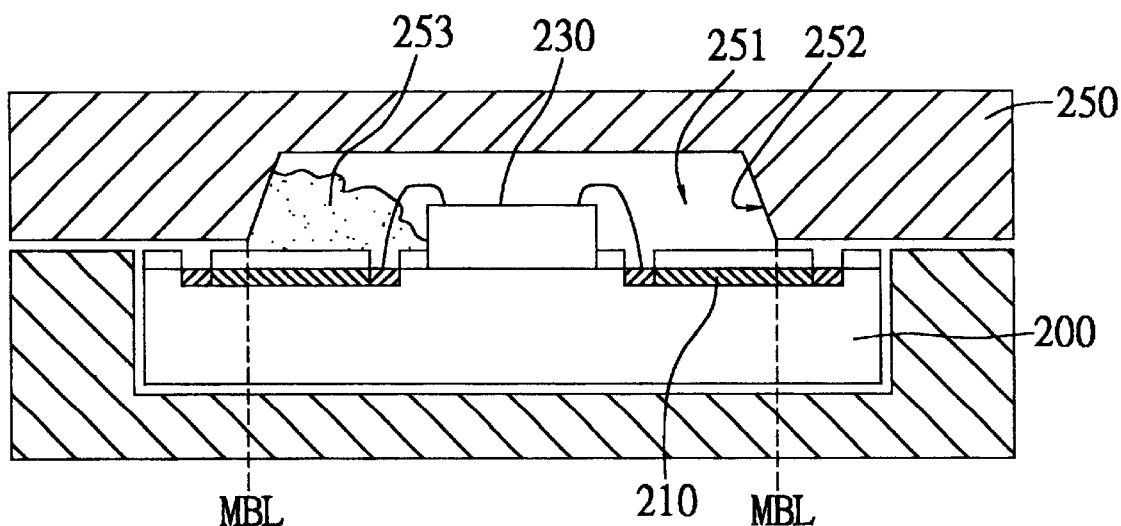

Referring further to FIG. 3D, in the next step, an molding process is performed by using a molding tool 250 having a hollowed cavity 251; wherein the semi-finished package assembly shown in FIG. 3A is fixed in the cavity 251 of the molding tool 250, with the inner wall 252 of the cavity 251 being aligned to the predefined mold border line MBL on the substrate 200. A molding material 253, such as epoxy resin, is then injected through an injection path (not shown) into the cavity 251 of the molding tool 250 until filling up the entire void space of the cavity 251.

Figure 3E:
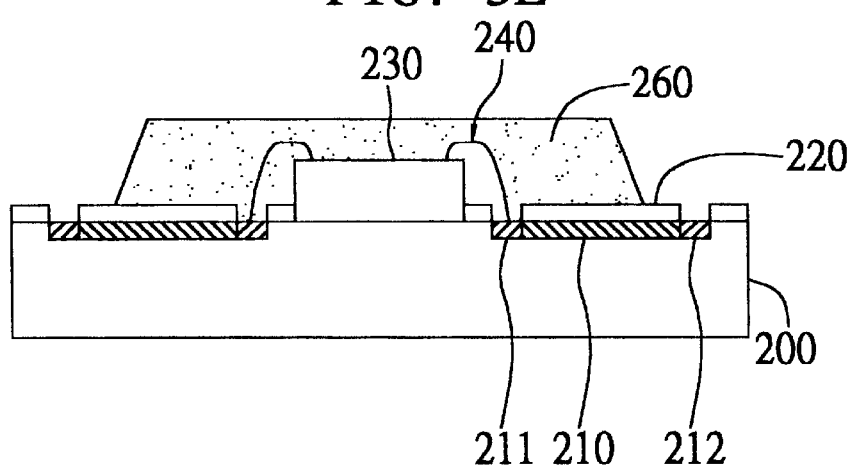

Referring further to FIG. 3E, as the molding process is completed, an encapsulation body 260 is formed over the molding region 201 of the substrate 200 to encapsulate the semiconductor chip 230.

During the foregoing molding process, owing to the provision of the dummy traces 213, no leakage hole would exist between the molding tool 250 and the solder mask 220. Therefore, the invention can help prevent mold flash over the non-molding region 202 of the substrate 200 just outside the encapsulation body 260. This feature allows the finished semiconductor package to be more assured in quality.

In conclusion, the invention provides a new method for fabricating a substrate-based semiconductor package without mold flash, which is characterized by the provision of one or more dummy traces between each overly-spaced pair of signal traces to help the solder mask covering over these traces to be substantially planarized in its top surface without the undesired forming of a recessed portion that would otherwise cause leakage of molding material to the outside of the molding region during molding process. Owing to the provision of these dummy traces, no leakage hole would exist between the molding tool and the solder mask, thus preventing mold flash. The proposed method therefore allows the finished semiconductor package to be more assured in quality.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a substrate-based semiconductor package, comprising the steps of:
   (1) preparing a substrate having one surface partitioned by a mold border line into a molding region and a non-molding region:
   (2) providing a plurality of electrically-conductive traces over the substrate, each trace having an inner terminal located within the molding region and an outer terminal located within the non-molding region;
   (3) providing a plurality of dummy traces across the mold border line and interposed between those electrically-conductive traces that are spaced at an interval greater than a minimum flash-causing distance;
   (4) providing a solder mask over the substrate to cover the electrically-conductive traces and the dummy traces; and (5) performing a molding process to form an encapsulation body on the molding region of the substrate.

2. The method of claim 1, wherein in said step (2), the electrically-conductive traces are fabricated from copper.

3. The method of claim 1, wherein in said step (3), the dummy traces are fabricated from copper.

4. The method of claim 1, wherein said minimum flash-causing distance is preferably not greater than 0.9 mm.

5. The method of claim 1, wherein said minimum flash-causing distance is more preferably not greater than 0.5 mm.

* * * * *